US011901871B2

(12) United States Patent
Imai

(10) Patent No.: US 11,901,871 B2
(45) Date of Patent: *Feb. 13, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hitoshi Imai, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/155,267

(22) Filed: Jan. 17, 2023

(65) Prior Publication Data

US 2023/0155561 A1    May 18, 2023

Related U.S. Application Data

(63) Continuation of application No. 17/194,985, filed on Mar. 8, 2021, now Pat. No. 11,581,863.

(30) Foreign Application Priority Data

Sep. 15, 2020  (JP) ................................. 2020-154727

(51) Int. Cl.
*H03F 1/02*    (2006.01)
*H03G 3/30*    (2006.01)

(52) U.S. Cl.
CPC ......... *H03G 3/3089* (2013.01); *H03F 1/0216* (2013.01)

(58) Field of Classification Search
CPC ........ H03F 1/0216; H03F 2203/45522; H03F 3/45475; H03F 3/68; H03G 3/3089; H03G 3/001; H03G 3/30; H03M 1/183
(Continued)

(56) References Cited

U.S. PATENT DOCUMENTS 4,862,516 A    8/1989   Macnak et al.
5,903,513 A    5/1999   Itou
(Continued)

FOREIGN PATENT DOCUMENTS

JP    H07-22867 A     1/1995
JP    H10-269768 A    10/1998
(Continued)

*Primary Examiner* — Andrea Lindgren Baltzell
*Assistant Examiner* — Khiem D Nguyen
(74) *Attorney, Agent, or Firm* — Kim & Stewart LLP

(57) ABSTRACT

According to one embodiment, a semiconductor device includes the following configuration. A detection circuit detects a state of a clock signal. An amplification circuit changes a gain based on the state of the clock signal detected by the detection circuit. An amplification circuit amplifies a first voltage with the gain and outputs a second voltage obtained as a result of amplification. A conversion circuit converts the second voltage output from the amplification circuit to first data. An isolation circuit includes a driver and a receiver electrically isolated from the driver. The driver transmits a signal corresponding to the first data to the receiver. The receiver outputs second data corresponding to the signal transmitted from the driver. The output circuit outputs the second data output from the isolation circuit.

19 Claims, 8 Drawing Sheets

(58) Field of Classification Search
USPC .................................................. 330/279, 149
See application file for complete search history.

(56) References Cited

U.S. PATENT DOCUMENTS

| | | | |
|---|---|---|---|
| 6,084,478 | A | 7/2000 | Mayampurath |
| 11,581,863 | B2 * | 2/2023 | Imai ........................ H03G 3/30 |
| 2003/0197966 | A1 | 10/2003 | Yamazaki et al. |
| 2006/0079191 | A1 * | 4/2006 | Parssinen ............... H04B 1/109 |
| | | | 455/67.11 |
| 2010/0194620 | A1 | 8/2010 | Kijima |
| 2011/0188864 | A1 | 8/2011 | Uo |
| 2013/0182595 | A1 | 7/2013 | Shimizu et al. |

FOREIGN PATENT DOCUMENTS

| | | |
|---|---|---|
| JP | 2002-136178 A | 5/2002 |
| JP | 2002-523952 A | 7/2002 |
| JP | 2003-317205 A | 11/2003 |
| JP | 2010-178204 A | 8/2010 |
| JP | 2011-160096 A | 8/2011 |
| JP | 2013-149021 A | 8/2013 |
| JP | 2017-163342 A | 9/2017 |

* cited by examiner

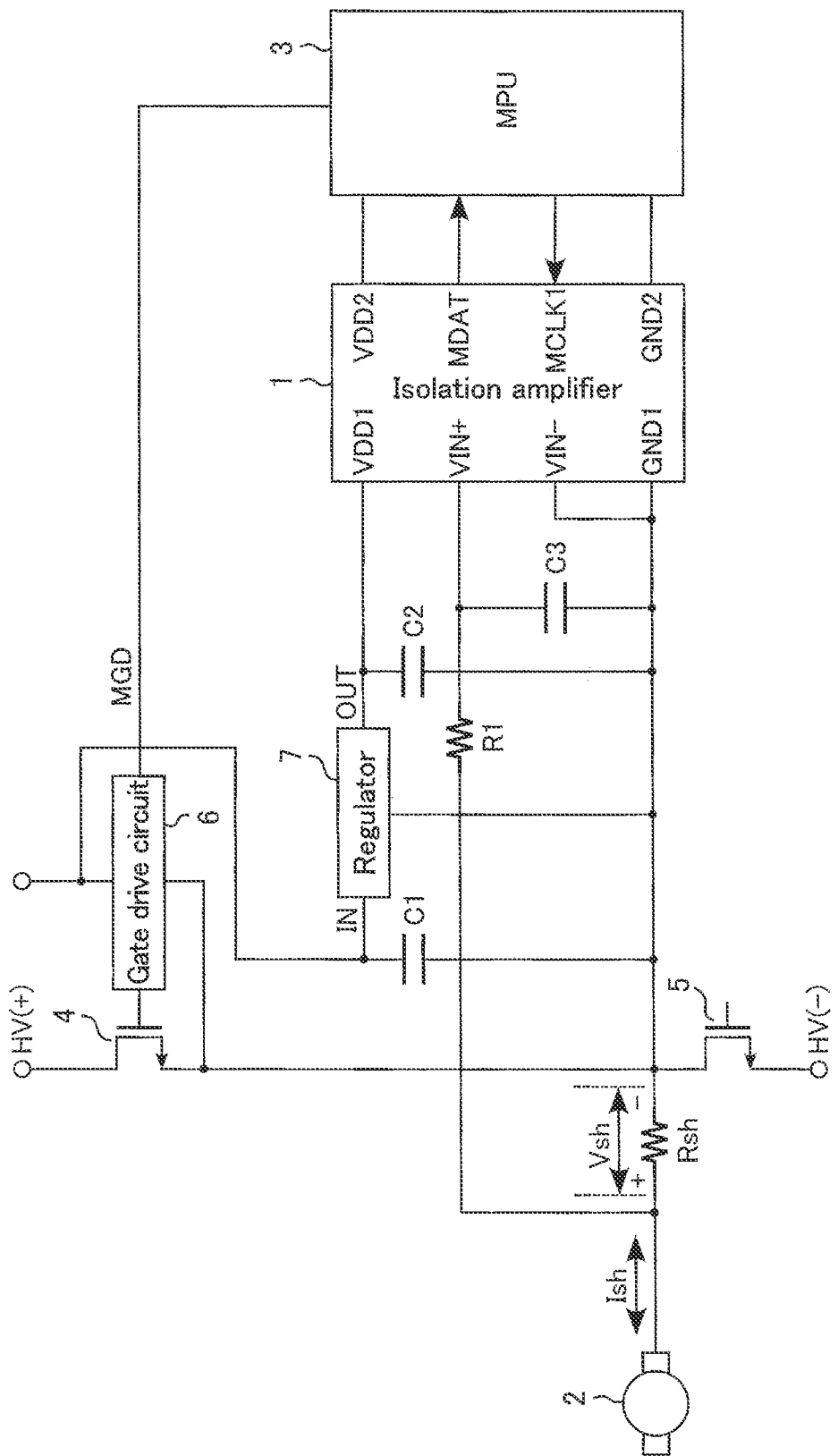
F I G. 1

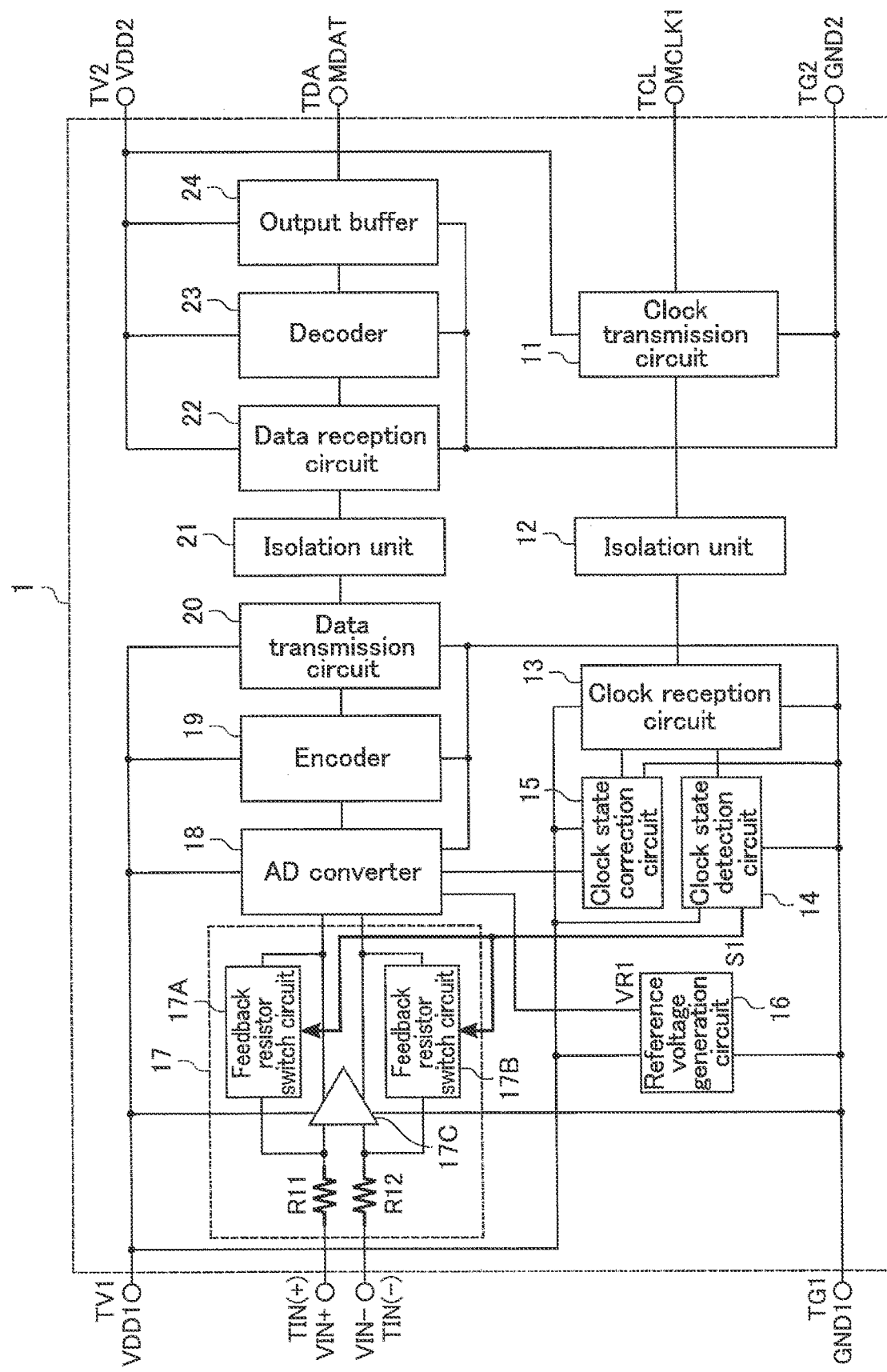
F I G. 2

| Clock state of clock signal | Resistances of feedback resistor switch circuits 17A & 17B | Resistances of input resistors R11 & R12 | Gain of the amplification circuit 17 | Ratio of input dynamic range to reference voltage generation circuit 16 |
|---|---|---|---|---|
| A | R | R | 1 | 1 |
| B | 5R | R | 5 | 1/5 |

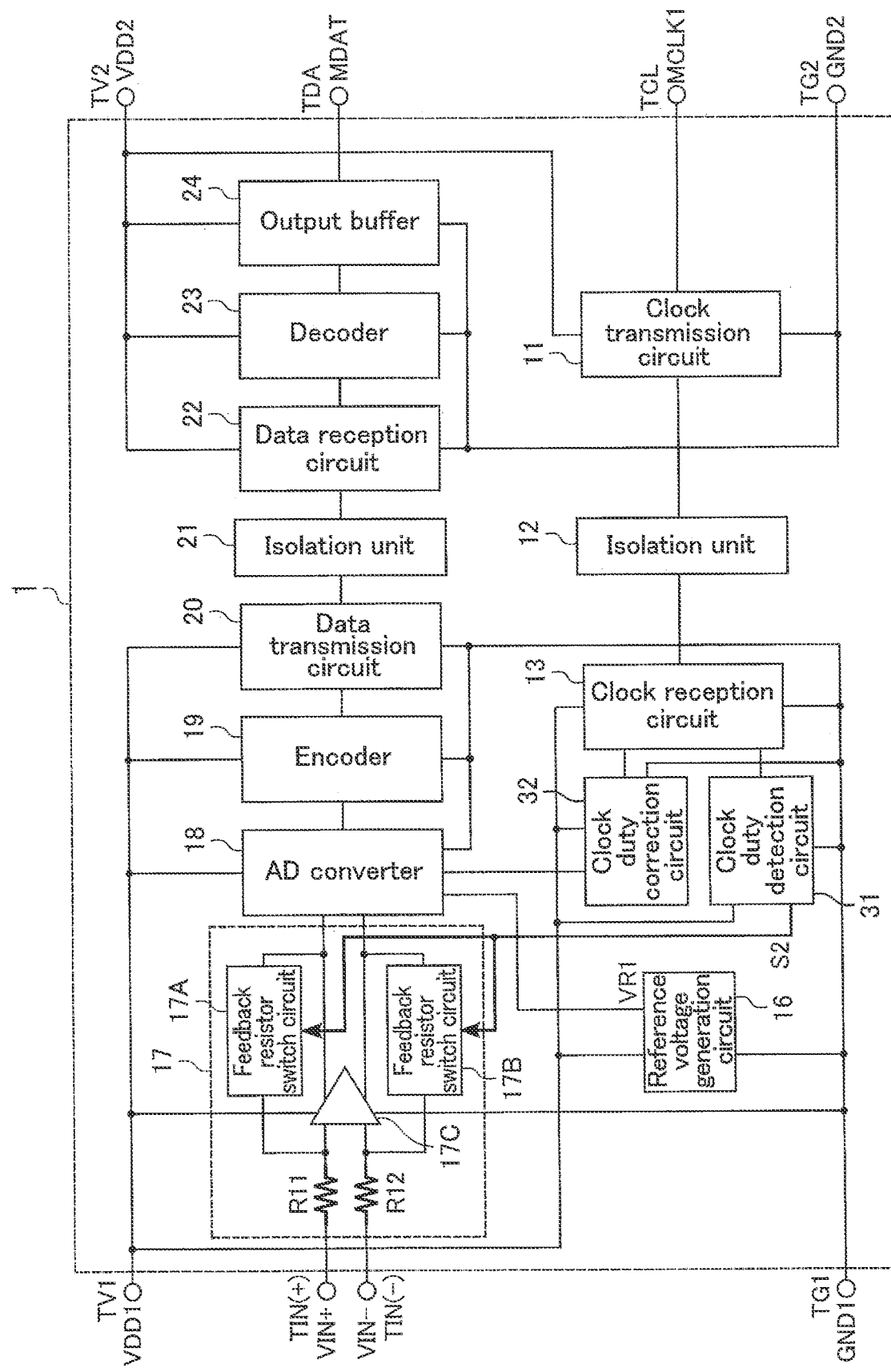
F I G. 7

| Duty ratio of clock signal (ratio of H) | Resistances of feedback resistor switch circuits 17A & 17B | Resistances of input resistors R11 & R12 | Gain of the amplification circuit 17 | Ratio of input dynamic range to reference voltage generation circuit 16 |
|---|---|---|---|---|
| Lower than 50% | R | R | 1 | 1 |
| 50% or higher | 5R | R | 5 | 1/5 |

F I G. 8

SEMICONDUCTOR DEVICE

CROSS-REFERENCE TO RELATED APPLICATIONS

This application is a continuation of U.S. patent application Ser. No. 17/194,985, filed Mar. 8, 2021, which is based upon and claims the benefit of priority from the Japanese Patent Application No. 2020-154727, filed Sep. 15, 2020, the entire contents of each of which are incorporated herein by reference.

FIELD

Embodiments described herein relate generally to a semiconductor device including an isolation amplifier.

BACKGROUND

An isolation amplifier with an input circuit and an output circuit being electrically isolated from each other has been known.

BRIEF DESCRIPTION OF THE DRAWINGS

FIG. 1 is a diagram showing an exemplary circuit for a current detection, in which an isolation amplifier according to a present embodiment is included.

FIG. 2 is a block diagram showing a structure of a semiconductor device including the isolation amplifier according to a first embodiment.

FIG. 7 is a block diagram showing a structure of a semiconductor device including an isolation amplifier according to a second embodiment.

FIG. 8 is a diagram showing an example of switching of a dynamic range of an input voltage in the isolation amplifier according to the second embodiment.

DETAILED DESCRIPTION

Figures 3, 4:
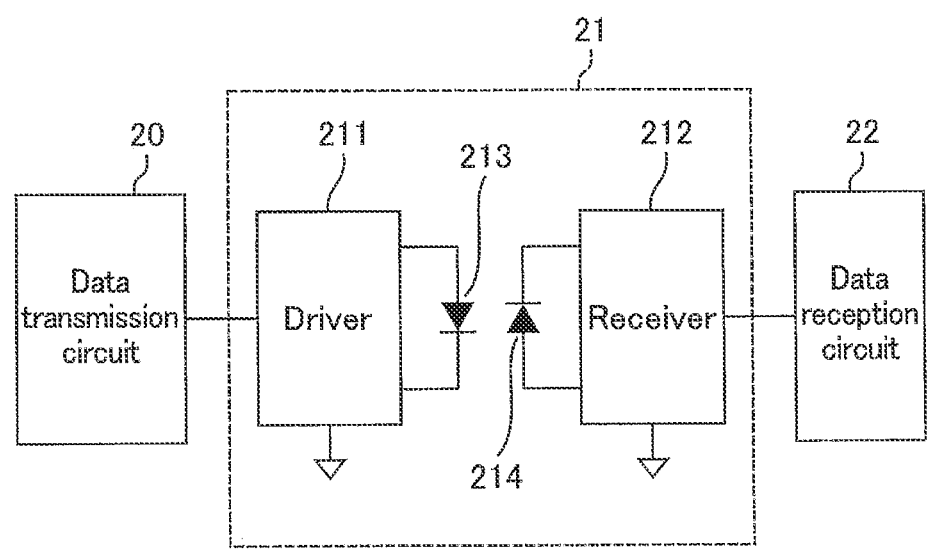
FIG. 3 is a diagram showing an example of switching of a dynamic range of an input voltage in the isolation amplifier according to the first embodiment.
FIG. 4 is a diagram showing an exemplary structure of an isolation unit for which optical coupling is adopted in the isolation amplifier.

In general, according to one embodiment, a semiconductor device includes a detection circuit, an amplification circuit, a conversion circuit, a first isolation circuit and an output circuit. The detection circuit is configured to detect a state of a first clock signal. The amplification circuit is configured to change a gain based on the state of the first clock signal detected by the detection circuit. The amplification circuit amplifies a first voltage with the gain and outputs a second voltage obtained as a result of amplification. The conversion circuit is configured to convert the second voltage output from the amplification circuit to first data. The first isolation circuit includes a first driver and a first receiver electrically isolated from the first driver. The first driver transmits a signal corresponding to the first data to the first receiver. The first receiver outputs second data corresponding to the signal transmitted from the first driver. The output circuit is configured to output the second data output from the first isolation circuit.

The embodiments of the present invention will be explained with reference to the drawings. In the explanation, components having the same functions and structures will be indicated by the same reference symbols. The embodiments described below merely provide exemplary apparatuses or methods for implementing the technical concepts of the embodiments, and therefore the materials, shapes, structures, arrangements, and the like of their structural components are not limited to the description below.

The function blocks can be implemented in the form of hardware, computer software, or a combination thereof. The function blocks may not be necessarily distinguished as in the examples. Part of the functions may be executed by a function block different from the illustrated function block. The illustrated function blocks may be divided into smaller sub-blocks.

1. Embodiment 1

An isolation amplifier is a device that has an isolating function for electrically isolating an input circuit and output circuit from each other, and at the same time a signal transmitting function for transmitting signals between the input circuit and output circuit. Such an isolation amplifier has been widely used in various fields including industrial products, communications, consumer products, and vehicle-mounted products.

FIG. 1 is a diagram showing an exemplary circuit for a current detection, in which the isolation amplifier according to the present embodiment is included. In this exemplary circuit, an isolation amplifier 1 is used for detection of a current supplied to a motor 2.

As illustrated in FIG. 1, the isolation amplifier 1 is coupled between the motor 2 and a micro processing unit (MPU) (or application specific integrated circuit (ASIC), digital signal processor (DSP), and the like) 3.

The power supply end to which a voltage of a positive power supply HV(+) is supplied is coupled to the motor 2 via an insulated gate bipolar transistor (IGBT) (or metal oxide semiconductor field effect transistor (MOSFET)) 4 and a shunt resistor Rsh, which are serially coupled to each other. The shunt resistor Rsh is coupled between the IGBT 4 and the motor 2. The first node between the shunt resistor Rsh and the motor 2 is coupled to the isolation amplifier 1 via a resistor R1. A voltage Vsh at the first node is input to the isolation amplifier 1. The second node between the IGBT 4 and the shunt resistor Rsh is coupled to the isolation amplifier 1, and also to the power supply end to which a voltage of a negative power supply HV(−) is supplied via a transistor 5. The voltage of the second node, which serves as a reference voltage, for example as a ground voltage GND1, is supplied to the isolation amplifier 1. The gate of the IGBT 4 is coupled to a gate drive circuit 6 of an insulation type.

A voltage of the positive power supply HV(+) is supplied to the input unit of a regulator 7. The regulator 7 generates a power supply voltage VDD1 from the voltage of the positive power supply HV(+), and supplies the generated voltage to the isolation amplifier 1. A capacitor C1 is coupled between the input unit of the regulator 7 and the second node, while a capacitor C2 is coupled between the output unit of the regulator 7 and the second node. Furthermore, a capacitor C3 is coupled between the second node and the node positioned between the resistor R1 and isolation amplifier 1.

The MPU 3 outputs to the gate drive circuit 6 a signal MGD for controlling a current Ish supplied to the motor 2. The gate drive circuit 6 outputs a drive voltage that corresponds to the signal MGD to the gate of the IGBT 4. In accordance with this drive voltage, the IGBT 4 can adjust the current Ish to be supplied to the motor 2.

The isolation amplifier 1 conducts signal transmission between the drive circuit of the motor 2 and the MPU 3, while maintaining an electrically isolated state between the drive circuit of the motor 2 and the MPU 3. From a signal obtained through the conversion of the current Ish to the voltage Vsh with the shunt resistor Rsh, the isolation amplifier 1 detects a current Ish to be supplied to the motor 2. In particular, the isolation amplifier 1 converts the current Ish to the voltage Vsh, and further converts the voltage Vsh to data so as to output this data to the MPU 3. Based on the received data, the MPU 3 adjusts the signal MGD to be output to the gate drive circuit 6 in a manner such that a desired amount of current is supplied to the motor 2.

A power loss $P=Vsh \times Ish$ produced by the shunt resistor Rsh needs to satisfy the permissible loss Psh of the shunt resistor Rsh. For this reason, to detect a large current Ish, a shunt resistor Rsh with a high power loss P should be selected, and the voltage Vsh should be reduced (i.e., a shunt resistor Rsh with a small resistance should be selected). Thus, for the isolation amplifier 1 to which the voltage Vsh is input, a product having a suitable dynamic range for the input voltage should be selected in accordance with the voltage Vsh.

1.1 Structure of Semiconductor Device

FIG. 2 is a block diagram showing the structure of a semiconductor device including the isolation amplifier of the first embodiment. The isolation amplifier 1 includes a clock transmission circuit 11, an isolation unit (or isolation circuit) 12, a clock reception circuit 13, a clock state detection circuit 14, a clock state correction circuit 15, a reference voltage generation circuit 16, an amplification circuit 17, an analog/digital conversion circuit (hereinafter referred to as an "AD converter") 18, an encoder 19, a data transmission circuit 20, an isolation unit (or isolation circuit) 21, a data reception circuit 22, a decoder 23, and an output buffer (or output circuit) 24.

A clock input terminal TCL is coupled to the input terminal of the clock transmission circuit 11. The output terminal of the clock transmission circuit 11 is coupled to the first terminal of the isolation unit 12, and the second terminal of the isolation unit 12 is coupled to the input terminal of the clock reception circuit 13. The first output terminal of the clock reception circuit 13 is coupled to the input terminal of the clock state detection circuit 14, and the second output terminal of the clock reception circuit 13 is coupled to the input terminal of the clock state correction circuit 15.

The output terminal of the clock state detection circuit 14 is coupled to the control terminals of the feedback resistor switch circuits 17A and 17B in the amplification circuit 17. The output terminal of the clock state correction circuit 15 is coupled to the first input terminal of the AD converter 18. The output terminal of the reference voltage generation circuit 16 is coupled to the second input terminal of the AD converter 18.

The voltage input terminal TIN(+) is coupled to the first end of an input resistor R11 in the amplification circuit 17. The second end of the input resistor R11 is coupled to the first input terminal of the amplification unit 17C and the first end of the feedback resistor switch circuit 17A. The first output terminal of the amplification unit 17C and the second end of the feedback resistor switch circuit 17A are coupled to the third input terminal of the AD converter 18.

The voltage input terminal TIN(−) is coupled to the first end of the input resistor R12 in the amplification circuit 17. The second end of the input resistor R12 is coupled to the second input terminal of the amplification unit 17C and to the first end of the feedback resistor switch circuit 17B. The second output terminal of the amplification unit 17C and the second end of the feedback resistor switch circuit 17B are coupled to the fourth input terminal of the AD converter 18.

The output terminal of the AD converter 18 is coupled to the input terminal of the encoder 19, and the output terminal of the encoder 19 is coupled to the input terminal of the data transmission circuit 20. The output terminal of the data transmission circuit 20 is coupled to the first terminal of the isolation unit 21, and the second terminal of the isolation unit 21 is coupled to the input terminal of the data reception circuit 22. The output terminal of the data reception circuit 22 is coupled to the input terminal of the decoder 23, and the output terminal of the decoder 23 is coupled to the input terminal of the output buffer 24. Furthermore, the output terminal of the output buffer 24 is coupled to the data output terminal TDA.

A ground voltage GND1 is supplied to the reference power supply terminal TG1. The reference power supply terminal TG1 is coupled to the negative-side power supply terminal of each of the clock reception circuit 13, clock state detection circuit 14, clock state correction circuit 15, reference voltage generation circuit 16, amplification circuit 17, AD converter 18, encoder 19, and data transmission circuit 20. A power supply voltage VDD1 is supplied to the power supply voltage terminal TV1. The power supply voltage terminal TV1 is coupled to the positive-side power supply terminal of each of the clock reception circuit 13, clock state detection circuit 14, clock state correction circuit 15, reference voltage generation circuit 16, amplification circuit 17, AD converter 18, encoder 19, and data transmission circuit 20.

A reference voltage, such as a ground voltage GND2, is supplied to the reference power supply terminal TG2. The reference power supply terminal TG2 is coupled to the negative-side power supply terminal of each of the clock transmission circuit 11, data reception circuit 22, decoder 23, and output buffer 24. Furthermore, a power supply voltage VDD2 is supplied to the power supply voltage terminal TV2. The power supply voltage terminal TV2 is coupled to the positive-side power supply terminal of each of the clock transmission circuit 11, data reception circuit 22, decoder 23, and output buffer 24.

1.2 Operation of Semiconductor Device

The operation of the semiconductor device including an isolation amplifier according to the first embodiment will be described below.

The clock transmission circuit 11 receives a clock signal MCLK1 from the MPU 3 through the clock input terminal TCL. The clock transmission circuit 11 transmits the clock signal MCLK1 to the isolation unit 12. The isolation unit 12 converts the clock signal MCLK1 received from the clock transmission circuit 11 to a clock signal MCLK2 that corresponds to the clock signal MCLK1, and outputs the clock signal MCLK2 to the clock reception circuit 13.

The clock reception circuit 13 outputs the received clock signal MCLK2 to the clock state detection circuit 14 and clock state correction circuit 15. The clock state detection circuit 14 detects the state of the clock signal MCLK2, and outputs a control signal S1 corresponding to this state to the feedback resistor switch circuits 17A and 17B. Hereinafter, the state of the clock signal may be referred to as a clock state. The clock state may be represented, for example, by a duty ratio, frequency, or voltage value of the clock signal MCLK2.

Each of the feedback resistor switch circuits 17A and 17B in the amplification circuit 17 has a feedback resistor, and switches the resistance value of the feedback resistor in accordance with the control signal S1. For instance, the feedback resistor switch circuit 17A may switch the resistance value of the feedback resistor in a manner such that the resistance value will be an integral multiple of the resistance value of the input resistor R11. The feedback resistor switch circuit 17B may switch the resistance value of the feedback resistor in a manner such that the resistance value will be an integral multiple of the resistance value of the input resistor R12. The gain of the amplification circuit 17 varies in accordance with the resistance value switched by the control signal S1. Changes in the gain of the amplification circuit 17 will be discussed later.

The voltage Vsh (VIN+) detected by the shunt resistor Rsh is input to the voltage input terminal TIN(+). Furthermore, the ground voltage GND1 (VIN−) is supplied to the voltage input terminal TIN(−). In this manner, the amplification circuit 17 receives the voltage Vsh and the ground voltage GND1 from the voltage input terminal TIN(+) and the voltage input terminal TIN(−), respectively.

The amplification circuit 17 amplifies the voltage Vsh with the gain set by the control signal S1, and outputs the amplified voltage Vsh to the AD converter 18. The AD converter 18 may be of a delta sigma type. Using a reference voltage VR1 supplied from the reference voltage generation circuit 16, the AD converter 18 converts the voltage Vsh (analog signal) amplified by the amplification circuit 17 to data D1 (digital signal), and outputs the data D1 to the encoder 19.

The clock state correction circuit 15 corrects the state of the clock signal MCLK2 to a suitable one for the use at the AD converter 18. For instance, a correction may be made to the clock signal MCLK2 in a manner such that its high (hereinafter referred to as "H") level and low (hereinafter referred to as "L") level demonstrate a duty ratio of 50:50. The clock state correction circuit 15 outputs the corrected clock signal to the AD converter 18.

The reference voltage generation circuit 16 generates a reference voltage VR1 to be used by the AD converter 18 for determination of a digital value, and outputs the generated reference voltage VR1 to the AD converter 18.

The AD converter 18 uses this reference voltage VR1 as a determination voltage level for converting the voltage Vsh, which is an analog signal, to data D1. For instance, when the voltage Vsh is higher than or equal to the reference voltage VR1, the AD converter 18 converts the voltage Vsh to H, while when the voltage Vsh is lower than the reference voltage VR1, the AD converter 18 converts the voltage Vsh to L.

The encoder 19 encodes the data D1 received from the AD converter 18, and outputs to the data transmission circuit 20 data D2 obtained as a result of the encoding. The data transmission circuit 20 transmits the data D2 to the isolation unit 21.

The isolation unit 21 converts the data D2 received from the data transmission circuit 20 to data D3 corresponding to the data D2, and outputs the data D3 to the data reception circuit 22. The data reception circuit 22 outputs the received data D3 to the decoder 23. The decoder 23 decodes the data D3 to convert to data MDAT, and outputs the data MDAT to the output buffer 24. The output buffer 24 outputs the data MDAT through the data output terminal TDA to the MPU 3.

Thereafter, based on the data MDAT received from the isolation amplifier 1, the MPU 3 generates a signal MGD. The signal MGD controls the current Ish to be supplied to the motor 2. The MPU 3 transmits the generated signal MGD to the gate drive circuit 6.

The gate drive circuit 6 generates a drive voltage based on the signal MGD, and outputs the generated drive voltage to the gate of the IGBT 4. In accordance with this drive voltage, the IGBT 4 adjusts the current Ish to be supplied to the motor 2 so that the operation of the motor 2 can be controlled.

Next, by referring to FIG. 3, an exemplary operation of switching the dynamic range of an input voltage in accordance with the clock signal MCLK1 supplied from the MPU 3 will be described. FIG. 3 is a diagram showing an example of switching of the dynamic range of an input voltage in the isolation amplifier 1. The dynamic range of an input voltage in the isolation amplifier 1 according to the first embodiment is set by the gain of the amplification circuit 17. The gain of the amplification circuit 17 is changed in accordance with the state of the clock signal MCLK1, and the dynamic range of the input voltage can be thereby switched.

For instance, when the clock state of the clock signal MCLK1 is "A" indicated in FIG. 3, the clock state detection circuit 14 outputs a control signal SA corresponding to the clock state A, to the feedback resistor switch circuits 17A and 17B. In accordance with this control signal SA, the feedback resistor switch circuits 17A and 17B respectively set the resistance values of their feedback resistors to "R". Here, the resistance values of the input resistors R11 and R12 are both set to R. With the resistance values of the input resistors R11 and R12 being R, and the resistance values of the feedback resistors of the feedback resistor switch circuits 17A and 17B also being R, the gain of the amplification circuit 17 is set to 1. IN this case, the dynamic range of the input voltage in the isolation amplifier 1 is represented as 1 when the reference voltage supplied from the reference voltage generation circuit 16 stays constant.

On the other hand, when the clock state of the clock signal MCLK1 is "B" indicated in FIG. 3, the clock state detection circuit 14 outputs a control signal SB corresponding to the clock state B to the feedback resistor switch circuits 17A and 17B. The feedback resistor switch circuits 17A and 17B respectively set the resistance values of their feedback resistors in accordance with the control signal SB to five times R (hereinafter referred to as "5R"). Here, the resistance values of the input resistors R11 and R12 are both set to R. With the resistance values of the input resistors R11 and R12 being R, and the resistance values of the feedback resistors of the feedback resistor switch circuits 17A and 17B being 5R, the gain of the amplification circuit 17 is set to 5. IN this case, the dynamic range of the input voltage in the isolation amplifier 1 is represented as 1/5 when the reference voltage supplied of the reference voltage generation circuit 16 stays constant.

As described above, according to the first embodiment, the gain of the amplification circuit 17 can be changed in accordance with the clock state of the clock signal MCLK1 received from the MPU 3, and the dynamic range of the input voltage thereby can be changed in the isolation amplifier 1.

The first embodiment is configured to detect either one of two clock states A and B demonstrated by the clock signal MCLK1 and set the gain of the amplification circuit 17 to either one of two gains (1 or 5) accordingly. It is also possible for one of three or more clock states to be detected and for one of three or more gains to be set. IN this case, the number of states demonstrated by the control signal S1 and the number of resistance values of the feedback resistors switched by the feedback resistor switch circuits 17A and 17B can also be suitably designed to match the number of clock states.

Figure 5:
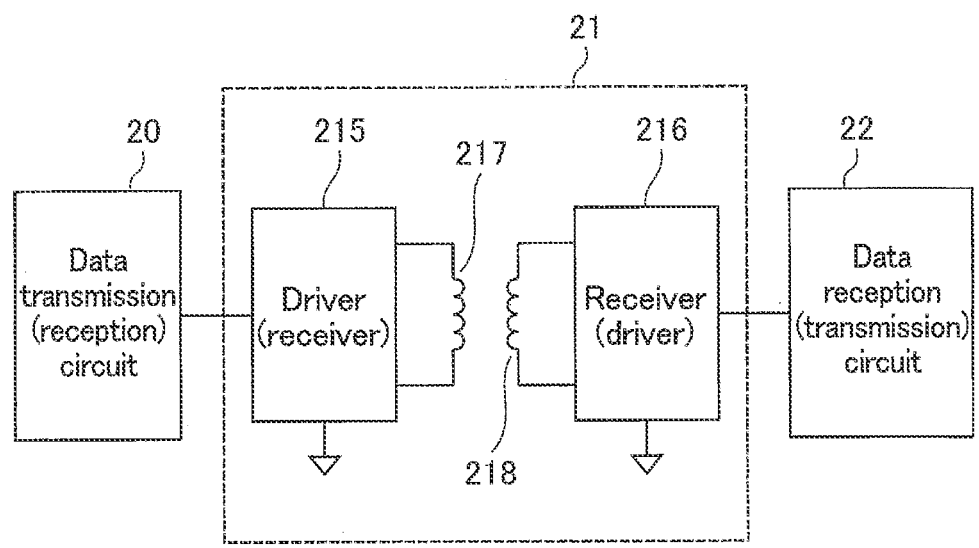
FIG. 5 is a diagram showing an exemplary structure of an isolation unit for which magnetic coupling is adopted in the isolation amplifier.
Figure 6:
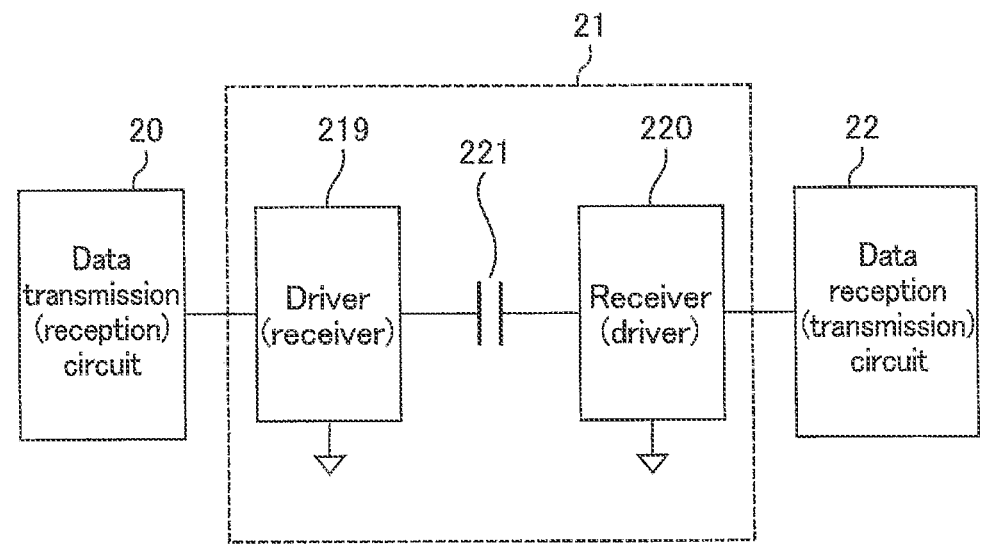
FIG. 6 is a diagram showing an exemplary structure of an isolation unit for which capacitive coupling is adopted in the isolation amplifier.

Next, by referring to FIGS. 4 to 6, exemplary structures of the isolation units 12 and 21 in the isolation amplifier 1 will be described. FIGS. 4 to 6 are diagrams showing exemplary structures of the isolation units 12 and 21.

The isolation units 12 and 21 may incorporate optical coupling, magnetic coupling, or capacitive coupling, which enables unidirectional or bidirectional signal transmission between the primary-side circuit (e.g., output circuit) and the secondary-side circuit (e.g., input circuit) while maintaining the insulative state between the primary-side circuit and secondary-side circuit.

FIG. 4 shows an exemplary structure of the isolation unit 21 in which optical coupling is adopted. The isolation unit 21 with optical coupling includes a driver 211, a receiver 212, a light emitting diode 213, and a photodiode 214. In this isolation unit 21, data can be transmitted unidirectionally from the light emitting diode 213 to the photodiode 214.

The driver 211 drives the light emitting diode 213 based on the data D2 received from the data transmission circuit 20. The light emitting diode 213 thereby emits light corresponding to the data D2. The photodiode 214 receives the light emitted from the light emitting diode 213, and outputs the data D3 in accordance with this light to the receiver 212. The receiver 212 outputs the received data D3 to the data reception circuit 22. Thus, the isolation unit 21 can transmit to the data reception circuit 22 the data D3 corresponding to the data D2 received from the data transmission circuit 20, while maintaining electrical insulation between the data transmission circuit 20 and the data reception circuit 22.

FIG. 5 shows an exemplary structure of the isolation unit 21 in which magnetic insulation is adopted. The isolation unit 21 includes a driver (or receiver) 215, a receiver (or driver) 216, a coil 217, and a coil 218. In this isolation unit 21, data can be transmitted bidirectionally between the driver (or receiver) 215 and the receiver (or driver) 216.

The driver 215 drives the coil 217 based on the data D2 received from the data transmission (reception) circuit 20. The coil 217 thereby generates magnetism corresponding to the data D2. Under the magnetism generated by the coil 217, the coil 218 outputs to the receiver 216 the data D3 corresponding to the magnetism. The receiver 216 outputs the received data D3 to the data reception (transmission) circuit 22. Thus, the isolation unit 21 can transmit to the data reception circuit 22 the data D3 corresponding to the data D2 received from the data transmission circuit 20, while maintaining electrical insulation between the data transmission circuit 20 and the data reception circuit 22.

FIG. 6 shows an exemplary structure of the isolation unit 21 in which capacitive coupling is adopted. The isolation unit 21 includes a driver (or receiver) 219, a receiver (or driver) 220, and a capacitor 221 coupled between the driver 219 and the receiver 220. The capacitor 221 includes a first electrode and a second electrode that face each other. The first electrode is coupled to the driver 219, and the second electrode is coupled to the receiver 220.

The driver 219 charges the first electrode of the capacitor 221 in accordance with the data D2 received from the data transmission (reception) circuit 20. The second electrode stores an electrical charge corresponding to the electrical charge stored in the first electrode. The receiver 220 outputs to the data reception (transmission) circuit 22 the data D3 corresponding to the electrical charge stored in the second electrode. Thus, the isolation unit 21 can transmit to the data reception circuit 22 the data D3 corresponding to the data D2 received from the data transmission circuit 20, while maintaining electrical insulation between the data transmission circuit 20 and the data reception circuit 22.

The isolation unit 12 has a structure similar to the structure of the isolation unit 21 that has been described above. For the isolation unit 12, the data transmission circuit 20 and the data reception circuit 22 should be replaced with the clock transmission circuit 11 and the clock reception circuit 13, respectively, and the data D2 and the data D3 should be replaced with the first clock signal and the second clock signal, respectively.

1.3 Effects of First Embodiment

According to the first embodiment, an isolation amplifier configured to change the dynamic range of an input voltage in accordance with an externally input signal can be offered.

Issues in an isolation amplifier of a comparative example will be discussed, and thereafter the effects produced by the isolation amplifier according to the first embodiment will be explained.

In the isolation amplifier of a comparative example, the dynamic range of an input voltage is determined by the circuit structure and design of the isolation amplifier, and therefore the user is not allowed to make any adjustments to the dynamic range. Even if an input terminal can be added to the isolation amplifier to externally adjust the dynamic range of the input voltage, this will increase the number of input terminals (the number of pins) of the isolation amplifier, increasing the size of a package of the isolation amplifier. The isolation amplifier of the comparative example may be configured in a manner such that a digital code can be externally input prior to the operation and stored in the register of the isolation amplifier in order to set the gain of the amplification circuit or the reference voltage of the reference voltage generation circuit in accordance with the digital code stored in the register. During the operation of the isolation amplifier, however, no change can be made to the dynamic range.

In contrast, according to the first embodiment, the gain of the amplification circuit 17 can be changed in accordance with the state of an externally supplied clock signal by changing the state of the clock signal. Thus, without adding an external input terminal, the dynamic range of the input voltage can be changed in the isolation amplifier. That is, an isolation amplifier configured to change the dynamic range of an input voltage based on the state of an externally supplied clock signal can be offered.

For instance, an idle state in which the input voltage to the isolation amplifier 1 is approximately 50 mV and a small current flows into the motor 2, and a normal operation state in which the input voltage is approximately 200 mV and a sufficient current flows into the motor 2 are considered. In either of these states, the dynamic range of the input voltage can be changed in accordance with the operation state, and the input voltage thereby can be accurately detected.

In other words, the input voltage varies in accordance with the current flowing into the motor 2. The input voltage can be accurately detected by changing the dynamic range of the input voltage in accordance with the corresponding one of the idle state and normal operation state. As a result, the current flowing into the motor 2 can be accurately detected.

In addition, the dynamic range of the input voltage is changed in accordance with the capacity of the adopted motor, for example a motor having a small or medium capacity corresponding to the input voltage of 200 mV, or a motor having a large capacity corresponding to the input voltage of 50 mV, so that the input voltage can always be accurately detected for motors of different capacities.

2. Second Embodiment

A semiconductor device including an isolation amplifier according to the second embodiment will be explained below. According to the second embodiment, the dynamic range of an input voltage can be changed in the isolation amplifier 1 by switching the resistance values of the feedback resistor switch circuits 17A and 17B in the amplification circuit 17 in accordance with the duty ratio of the externally supplied clock signal MCLK1. The explanation of the second embodiment will focus mainly on the points that differ from the first embodiment. Configurations, operations and effects that are not mentioned here are the same as in the first embodiment.

2.1 Structure of Semiconductor Device

FIG. 7 is a block diagram showing the structure of a semiconductor device including an isolation amplifier according to the second embodiment. The isolation amplifier according to the second embodiment includes a clock duty detection circuit 31 in place of the clock state detection circuit 14, and a clock duty correction circuit 32 in place of the clock state correction circuit 15.

The first output terminal of the clock reception circuit 13 is coupled to the input terminal of the clock duty detection circuit 31, and the second output terminal of the clock reception circuit 13 is coupled to the input terminal of the clock duty correction circuit 32.

The output terminal of the clock duty detection circuit 31 is coupled to the control terminals of the feedback resistor switch circuits 17A and 17B in the amplification circuit 17. The output terminal of the clock duty correction circuit 32 is coupled to the first input terminal of the AD converter 18.

2.2 Operation of Semiconductor Device

The operation of the semiconductor device including the isolation amplifier according to the second embodiment will be described below.

The clock reception circuit 13 outputs the received clock signal MCLK2 to the clock duty detection circuit 31 and the clock duty correction circuit 32. The clock duty detection circuit 31 detects the duty ratio of the clock signal MCLK2, and outputs a control signal S2 corresponding to this duty ratio to the feedback resistor switch circuits 17A and 17B.

Each of the feedback resistor switch circuits 17A and 17B in the amplification circuit 17 switches the resistance value of the feedback resistor in accordance with the control signal S2. For instance, the feedback resistor switch circuit 17A may switch the resistance value of its feedback resistor in a manner such that the resistance value will be an integral multiple of the resistance value of the input resistor R11. The feedback resistor switch circuit 17B may switch the resistance value of its feedback resistor in a manner such that the resistance value will be an integral multiple of the resistance value of the input resistor R12. The gain of the amplification circuit 17 varies in accordance with the resistance value switched by the control signal S2. Changes in the gain of the amplification circuit 17 will be discussed later.

The amplification circuit 17 amplifies the voltage Vsh with the gain set by the control signal S2, and outputs the amplified voltage Vsh to the AD converter 18. Furthermore, using the reference voltage VR1 supplied from the reference voltage generation circuit 16, the AD converter 18 converts the voltage Vsh (analog signal) amplified by the amplification circuit 17 to data D1, and outputs the data D1 to the encoder 19.

The encoder 19 encodes the received data D1, and outputs to the data transmission circuit 20 data D2 obtained as a result of the encoding. The data transmission circuit 20 transmits the data D2 to the isolation unit 21.

The isolation unit 21 converts the data D2 received from the data transmission circuit 20 to data D3 corresponding to the data D2, and outputs the data D3 to the data reception circuit 22. The data reception circuit 22 outputs the received data D3 to the decoder 23. The decoder 23 decodes the data D3 to convert to data MDAT, and outputs the data MDAT to the output buffer 24. The output buffer 24 outputs the data MDAT through the data output terminal TDA to the MPU 3.

Thereafter, the MPU 3 generates a signal MGD based on the data MDAT received from the isolation amplifier 1, and transmits the generated signal MGD to the gate drive circuit 6. The gate drive circuit 6 generates a drive voltage based on the signal MGD, and outputs the generated drive voltage to the gate of the IGBT 4. In accordance with the drive voltage, the IGBT 4 adjusts the current Ish to be supplied to the motor 2 so that the operation of the motor 2 can be controlled.

Next, by referring to FIG. 8, an exemplary operation of switching the dynamic range of an input voltage in accordance with the clock signal MCLK1 supplied from the MPU 3 will be described. FIG. 8 is a diagram showing an example of switching of the dynamic range of an input voltage in the isolation amplifier 1. The dynamic range of an input voltage in the isolation amplifier 1 according to the second embodiment is set by the gain of the amplification circuit 17. The gain of the amplification circuit 17 is changed in accordance with the duty ratio of the clock signal MCLK1, and the dynamic range of the input voltage is thereby switched.

For instance, when the ratio of the H level of the clock signal MCLK1 in one cycle is smaller than 50% as indicated in FIG. 8, the clock duty detection circuit 31 outputs to the feedback resistor switch circuits 17A and 17B a control signal SA corresponding to the ratio of the H level. In accordance with this control signal SA, the feedback resistor switch circuits 17A and 17B respectively set the resistance values of their feedback resistors to "R". Here, the resistance values of the input resistors R11 and R12 are both set to R. With the resistance values of the input resistors R11 and R12 being R, and the resistance values of the feedback resistor switch circuits 17A and 17B also being R, the gain of the amplification circuit 17 is set to 1. IN this case, the dynamic range of the input voltage in the isolation amplifier 1 is represented as 1 when the reference voltage supplied from the reference voltage generation circuit 16 stays constant.

On the other hand, when the ratio of the H level of the clock signal MCLK1 in one cycle is 50% or greater as indicated in FIG. 8, the clock duty detection circuit 31 outputs to the feedback resistor switch circuits 17A and 17B a control signal SB corresponding to the ratio of the H level. In accordance with this control signal SB, the feedback resistor switch circuits 17A and 17B respectively set the resistance values of their feedback resistors to 5R. Here, the resistance values of the input resistors R11 and R12 are both set to R. With the resistance values of the input resistors R11 and R12 being R, and the resistance values of the feedback resistor switch circuits 17A and 17B being 5R, the gain of the amplification circuit 17 is set to 5. IN this case, the dynamic range of the input voltage in the isolation amplifier 1 is represented as 1/5 when the reference voltage supplied of the reference voltage generation circuit 16 stays constant.

As described above, according to the second embodiment, the gain of the amplification circuit 17 can be changed in accordance with the clock state of the clock signal MCLK1 received from the MPU 3, and the dynamic range of the input voltage thereby can be changed in the isolation amplifier 1.

The second embodiment is configured to detect one of the two states of the duty ratio of the clock signal MCLK1 and set the gain of the amplification circuit 17 to one of two gains (1 or 5). It is also possible for one of three or more states of the duty ratio to be detected and for one of three or more gains to be set. IN this case, the number of states demonstrated by the control signal S2 and the number of resistance values of the feedback resistors switched by the feedback resistor switch circuits 17A and 17B can also be suitably designed to match the number of states of the duty ratio.

2.3 Effects of Second Embodiment

According to the second embodiment, an isolation amplifier configured to change the dynamic range of an input voltage in accordance with an externally input signal can be offered.

The effects of the isolation amplifier according to the second embodiment will be described below.

According to the second embodiment, the gain of the amplification circuit 17 can be changed in accordance with the duty ratio of an externally supplied clock signal by changing the duty ratio of the clock signal. Thus, without adding an external input terminal, the dynamic range of the input voltage can be changed in the isolation amplifier. That is, an isolation amplifier configured to change the dynamic range of an input voltage based on the duty ratio of an externally supplied clock signal can be offered.

For instance, an idle state in which the input voltage to the isolation amplifier 1 is approximately 50 mV and a small current flows into the motor 2, and a normal operation state in which the input voltage is approximately 200 mV and a sufficient current flows into the motor 2 are considered. In either of these states, the input voltage can be accurately detected by changing the dynamic range of the input voltage in accordance with the operation state.

In other words, the input voltage varies in accordance with the current flowing into the motor 2. The dynamic range of the input voltage can be changed in accordance with the corresponding one of the idle state and normal operation state in order to accurately detect the input voltage. As a result, the current flowing into the motor 2 can be accurately detected.

In addition, the input voltage can still be accurately detected for motors of different capacities by changing the dynamic range of the input voltage in accordance with the capacity of the adopted motor, for example a motor having a small or medium capacity corresponding to the input voltage of 200 mV, or a large capacity corresponding to the input voltage of 50 mV.

3. Third Embodiment

A semiconductor device including an isolation amplifier according to the third embodiment will be explained below. According to the third embodiment, the dynamic range of an input voltage can be changed by switching, in accordance with the state of the externally supplied clock signal MCLK1, the reference voltage used by the AD converter 18 as a determination voltage level. The explanation of the third embodiment will focus mainly on the points that differ from the first embodiment. Configurations, operations and effects that are not mentioned here are the same as in the first embodiment.

3.1 Structure of Semiconductor Device

Figure 9:
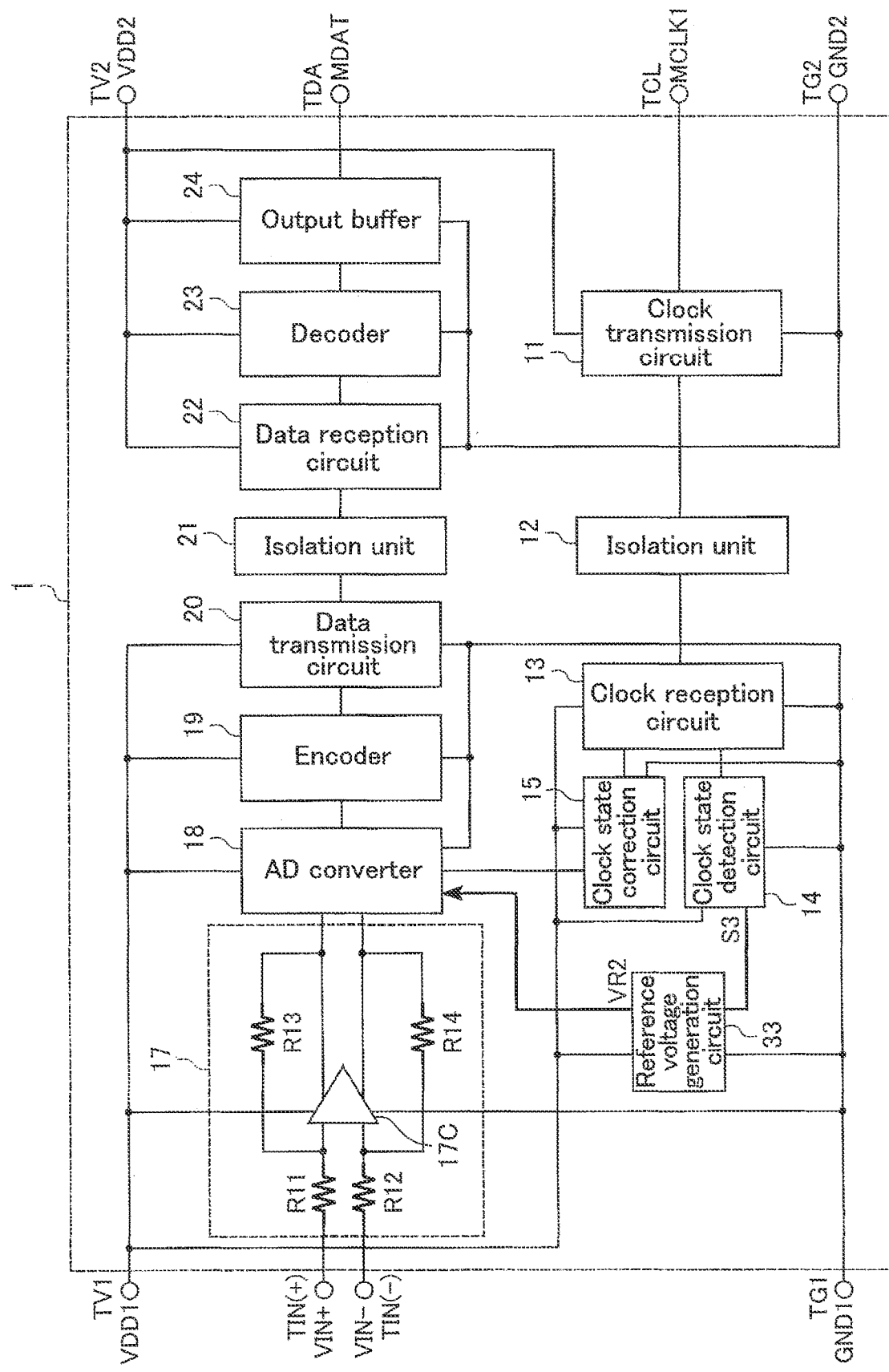
FIG. 9 is a block diagram showing a structure of a semiconductor device including an isolation amplifier according to a third embodiment.

FIG. 9 is a block diagram showing the structure of a semiconductor device including an isolation amplifier according to the third embodiment. The isolation amplifier according to the third embodiment includes a resistor R13 in place of the feedback resistor switch circuit 17A, and a resistor R14 in place of the feedback resistor switch circuit 17B.

The first output terminal of the clock reception circuit 13 is coupled to the input terminal of the clock state detection circuit 14, and the second output terminal of the clock reception circuit 13 is coupled to the input terminal of the clock state correction circuit 15.

The output terminal of the clock state detection circuit 14 is coupled to the control terminal of the reference voltage generation circuit 16. The output terminal of the reference voltage generation circuit 16 is coupled to the second input terminal of the AD converter 18.

The voltage input terminal TIN(+) is coupled to the first end of the input resistor R11 in the amplification circuit 17. The second end of the input resistor R11 is coupled to the first input terminal of the amplification unit 17C and the first end of the resistor R13. The first output terminal of the amplification unit 17C and the second end of the resistor R13 are coupled to the third input terminal of the AD converter 18.

The voltage input terminal TIN(−) is coupled to the first end of the input resistor R12 in the amplification circuit 17. The second end of the input resistor R12 is coupled to the second input terminal of the amplification unit 17C and the first end of the resistor R14. The second output terminal of the amplification unit 17C and the second end of the resistor R14 are coupled to the fourth input terminal of the AD converter 18.

3.2 Operation of Semiconductor Device

The operation of the semiconductor device including an isolation amplifier according to the third embodiment will be described below.

The clock reception circuit 13 outputs the received clock signal MCLK2 to the clock state detection circuit 14 and clock state correction circuit 15. The clock state detection circuit 14 detects the clock state of the clock signal MCLK2, and outputs a control signal S3 corresponding to this clock state to a reference voltage generation circuit 33. The reference voltage generation circuit 33 switches the voltage value of the reference voltage VR2 in accordance with the control signal S3.

The amplification circuit 17 amplifies the voltage Vsh and outputs it to the AD converter 18. The AD converter 18 converts the voltage Vsh to data D1 using the reference voltage VR2, and outputs the data D1 to the encoder 19. In particular, the AD converter 18 uses the reference voltage VR2 supplied from the reference voltage generation circuit 33, as a determination voltage level for converting the voltage Vsh to data D1. For instance, when the voltage Vsh is higher than or equal to the reference voltage VR2, the AD converter 18 converts the voltage Vsh to H, while when the voltage Vsh is lower than the reference voltage VR2, the AD converter 18 converts the voltage Vsh to L.

The encoder 19 encodes the received data D1, and outputs to the data transmission circuit 20 data D2 obtained as a result of the encoding. The data transmission circuit 20 transmits the data D2 to the isolation unit 21.

The isolation unit 21 converts the data D2 received from the data transmission circuit 20 to data D3 corresponding to the data D2, and outputs the data D3 to the data reception circuit 22. The data reception circuit 22 outputs the received data D3 to the decoder 23. The decoder 23 decodes the data D3 to convert to data MDAT, and outputs the data MDAT to the output buffer 24. The output buffer 24 outputs the data MDAT through the data output terminal TDA to the MPU 3.

Thereafter, the MPU 3 generates a signal MGD based on the data MDAT received from the isolation amplifier 1, and transmits the generated signal MGD to the gate drive circuit 6. The gate drive circuit 6 generates a drive voltage based on the signal MGD, and outputs the generated drive voltage to the gate of the IGBT 4. In accordance with the drive voltage, the IGBT 4 adjusts the current Ish to be supplied to the motor 2 so that the operation of the motor 2 can be controlled.

As discussed above, according to the third embodiment, the reference voltage used by the AD converter 18 as a determination voltage level is switched in accordance with the clock state of the clock signal MCLK1 received from the MPU 3, and therefore the data D1 obtained through the conversion by the AD converter 18 can be changed. In this manner, the dynamic range of the input voltage can be changed in the isolation amplifier 1.

3.3 Effects of Third Embodiment

According to the third embodiment, an isolation amplifier configured to change the dynamic range of an input voltage in accordance with an externally input signal can be offered.

The effects of the isolation amplifier according to the third embodiment will be described below.

According to the third embodiment, by changing the state of an externally supplied clock signal, the voltage value of the reference voltage VR2 generated by the reference voltage generation circuit 33 can be changed in accordance with the state of the clock signal. By using this reference voltage VR2 as a determination voltage level, the voltage Vsh is converted to a digital signal. In this manner, without adding an external input terminal, the dynamic range of the input voltage can be changed in the isolation amplifier 1. That is, an isolation amplifier configured to change the dynamic range of an input voltage based on the state of an externally supplied clock signal can be offered.

For instance, an idle state in which the input voltage to the isolation amplifier 1 is approximately 50 mV and a small current flows into the motor 2, and a normal operation state in which the input voltage is approximately 200 mV and a sufficient current flows into the motor 2 are considered. In either of these states, the input voltage can be accurately detected by changing the dynamic range of the input voltage in accordance with the operation state.

In other words, the input voltage varies in accordance with the current flowing into the motor 2. The input voltage can be accurately detected by changing the dynamic range of the input voltage in accordance with the corresponding one of the idle state and normal operation state. As a result, the current flowing into the motor 2 can be accurately detected.

In addition, the input voltage can still be accurately detected for motors of different capacities by changing the dynamic range of the input voltage in accordance with the capacity of the adopted motor, for example a motor having a small or medium capacity corresponding to the input voltage of 200 mV, or a large capacity corresponding to the input voltage of 50 mV.

4. Fourth Embodiment

A semiconductor device including an isolation amplifier according to the fourth embodiment will be explained below. According to the fourth embodiment, the transmission of the clock signal MCLK1 and data is conducted by a single isolation unit with a time division multiplexed signal, and the dynamic range of an input voltage can be thereby changed. The explanation of the fourth embodiment will focus mainly on the points that differ from the first embodiment. Configurations, operation and effects that are not mentioned here are the same as in the first embodiment.

4.1 Structure of Semiconductor Device

Figure 10:
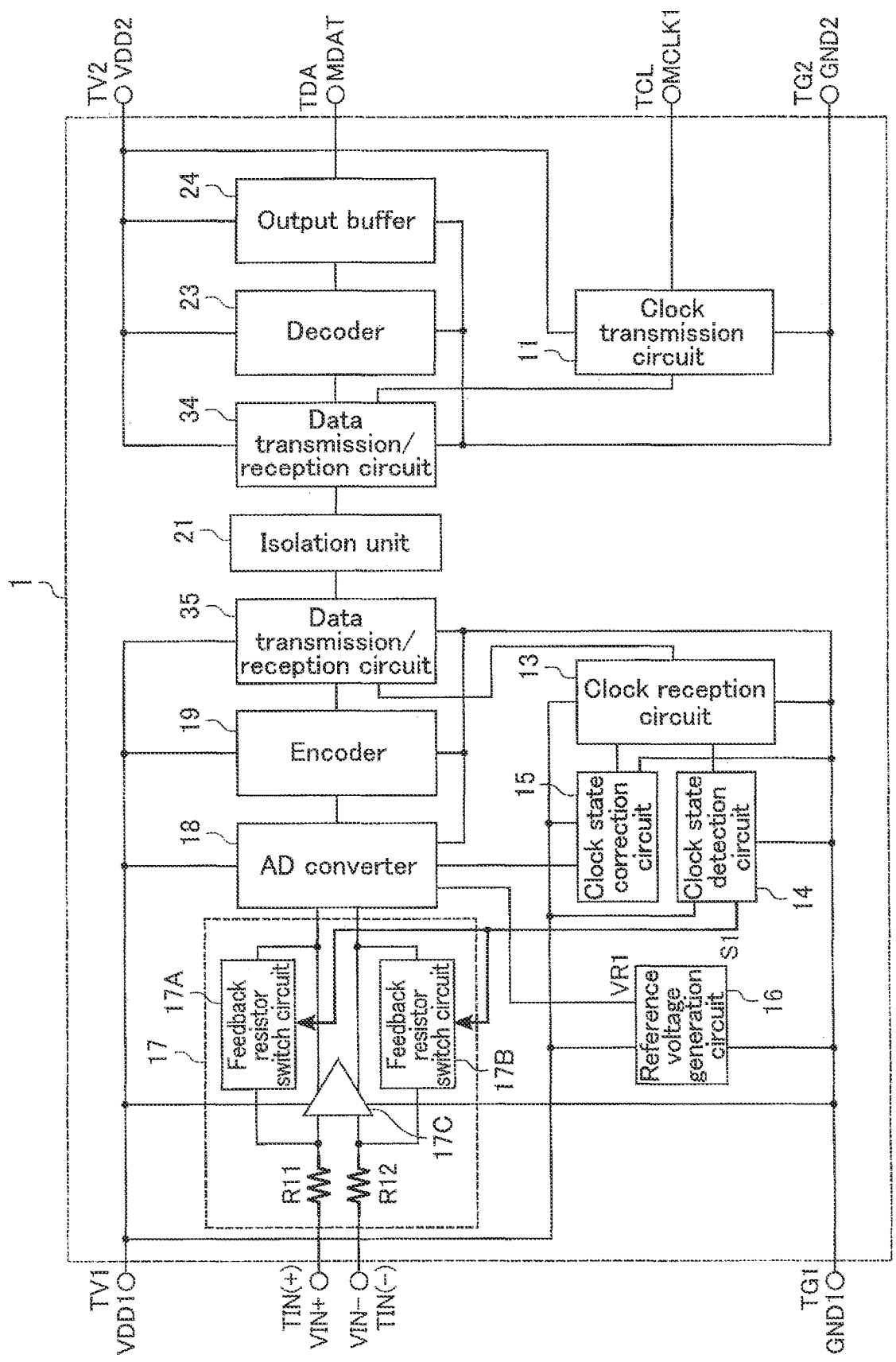
FIG. 10 is a block diagram showing a structure of a semiconductor device including an isolation amplifier according to a fourth embodiment.

FIG. 10 is a block diagram showing the structure of a semiconductor device including an isolation amplifier according to the fourth embodiment. The isolation amplifier according to the fourth embodiment includes data transmission/reception circuits 34 and 35, and an isolation unit 21. This isolation unit 21 conducts the transmission of the clock signal MCLK1 and data.

The output terminal of the clock transmission circuit 11 is coupled to the first terminal of the data transmission/reception circuit 34, and the second terminal of the data transmission/reception circuit 34 is coupled to the first terminal of the isolation unit 21. The second terminal of the isolation unit 21 is coupled to the first terminal of the data transmission/reception circuit 35, and the second terminal of the data transmission/reception circuit 35 is coupled to the input terminal of the clock reception circuit 13.

The output terminal of the encoder 19 is coupled to the third terminal of the data transmission/reception circuit 35; the first terminal of the data transmission/reception circuit 35 is coupled to the second terminal of the isolation unit 21; and the first terminal of the isolation unit 21 is coupled to the second terminal of the data transmission/reception circuit 34. The third terminal of the data transmission/reception circuit 34 is coupled to the input terminal of the decoder 23.

4.2 Operation of Semiconductor Device

The operation of the semiconductor device including an isolation amplifier according to the fourth embodiment will be described below.

The clock transmission circuit 11 transmits the clock signal MCLK1 to the data transmission/reception circuit 34. The data transmission/reception circuit 34 converts the clock signal MCLK1 to a time division multiplexed signal, and transmits the signal to the isolation unit 21. The isolation unit 21 receives the time division multiplexed signal from the data transmission/reception circuit 34, converts the time division multiplexed signal to another signal in accordance with the received signal, and outputs the converted signal to the data transmission/reception circuit 35. The data transmission/reception circuit 35 converts the signal received from the isolation unit 21 to a clock signal MCLK2, and outputs the converted signal to the clock reception circuit 13.

The clock reception circuit 13 outputs the received clock signal MCLK2 to the clock state detection circuit 14 and clock state correction circuit 15. The rest of the operation is the same as in the first embodiment.

Furthermore, the encoder 19 encodes the data D1 received from the AD converter 18, and outputs to the data transmission/reception circuit 35 data D2 obtained as a result of the encoding. The data transmission/reception circuit 35 converts this data D2 to a time division multiplexed signal, and transmits the signal to the isolation unit 21. The isolation unit 21 receives the time division multiplexed signal from the data transmission/reception circuit 34, converts the time division multiplexed signal to another signal in accordance with the received signal, and outputs the converted signal to the data transmission/reception circuit 34. The data transmission/reception circuit 34 converts the signal received from the isolation unit 21 to data D3, and outputs the data D3 to the decoder 23.

The decoder 23 decodes the data D3 to convert to data MDAT, and outputs the data MDAT to the output buffer 24. The output buffer 24 outputs the data MDAT through the data output terminal TDA to the MPU 3. The rest of the operation is the same as in the first embodiment.

As described above, according to the fourth embodiment, the gain of the amplification circuit 17 can be changed in accordance with the clock state of the clock signal MCLK1 received from the MPU 3, and the dynamic range of the input voltage thereby can be changed in the isolation amplifier 1.

The isolation unit 21 is provided with a transmission function through magnetic coupling or capacitive coupling, enabling the bidirectional transmission between the data transmission/reception circuit 34 and the data transmission/reception circuit 35.

4.3 Effects of Fourth Embodiment

According to the fourth embodiment, an isolation amplifier configured to change the dynamic range of an input voltage in accordance with an externally input signal can be offered.

In addition, according to the fourth embodiment, the structure of the isolation amplifier 1, with a single isolation unit incorporated, can be simplified. Other effects are the same as in the first embodiment.

5. Other Modification Examples

The aforementioned embodiments may have modified structures as indicated below.

According to the first embodiment, with the resistances of the input resistors R11 and R12 fixed, the resistance values of the feedback resistors in the feedback resistor switch circuits 17A and 17B are switched in accordance with the control signal S1 received from the clock state detection circuit 14. Instead, with the resistance values of the feedback resistors fixed, the resistance values of the input resistors R11 and R12 may be switched in accordance with the control signal S1 received from the clock state detection circuit 14.

Furthermore, according to the second embodiment, the state of the duty ratio of the clock signal, state A or state B, is detected, and the resistance values of the feedback resistors are switched in accordance with the detected state. The detection, however, may be such that a state may be detected from among three or more states so that the resistance values of the feedback resistors can be switched in accordance with the detected state.

According to the first to third embodiments, the clock state of the clock signal is detected by the primary-side circuit that includes the amplification circuit 17. The detection of the clock state of the clock signal, however, may be conducted by the secondary-side circuit that includes the output buffer 24, and the detected clock state can be sent to the primary-side circuit.

The embodiments of the present invention have been explained. These are presented merely as examples, and are not intended to restrict the scope of the invention. These embodiments may be realized in various other forms, and various omissions, replacements, and changes can be made without departing from the gist of the invention. Such embodiments and modifications are included in the scope and gist of the invention, and are included in the scope of the invention described in the claims and its equivalents.

What is claimed is:

1. A semiconductor device comprising:
   a detection circuit configured to detect a state of a first signal;
   an amplification circuit configured to change a gain based on the state of the first signal detected by the detection circuit, the amplification circuit amplifying a first voltage with the gain and outputting a second voltage obtained as a result of amplification, the amplification circuit including an amplification unit, and a feedback resistor switch circuit coupled between an input terminal and an output terminal of the amplification unit, the gain of the amplification circuit being changed by changing a resistance value of the feedback resistor switch circuit based on the state of the first signal; and
   a conversion circuit configured to convert the second voltage output from the amplification circuit to first data.

2. The semiconductor device according to claim 1, further comprising:
   a first isolation circuit including a first driver and a first receiver electrically isolated from the first driver, the first driver transmitting a first data signal corresponding to the first data to the first receiver, and the first receiver outputting a second data corresponding to the first data signal transmitted from the first driver;
   an output circuit configured to output the second data output from the first isolation circuit; and
   a second isolation circuit including a second driver and a second receiver electrically isolated from the second driver,
   wherein the second driver transmits a second data signal corresponding to a second signal to the second receiver, and the second receiver outputs to the detection circuit the first signal corresponding to the second data signal transmitted from the second driver.

3. The semiconductor device according to claim 1, further comprising:
   an isolation circuit including a first driver and receiver and a second driver and receiver, the second driver and receiver being electrically isolated from the first driver and receiver,
   wherein the first driver and receiver transmits a first data signal corresponding to the first data to the second driver and receiver, and the second driver and receiver outputs a second data corresponding to the first data signal transmitted from the first driver and receiver, and
   the second driver and receiver transmits a second data signal corresponding to a second signal to the first driver and receiver, and the first driver and receiver outputs to the detection circuit the first signal corresponding to the second data signal transmitted from the second driver and receiver.

4. The semiconductor device according to claim 1, further comprising:
   a correction circuit configured to correct the first signal,
   wherein the correction circuit outputs the corrected first signal to the conversion circuit, and
   the conversion circuit converts the second voltage output from the amplification circuit, to the first data, using the corrected first signal.

5. The semiconductor device according to claim 2, further comprising:
   an encoder configured to receive the first data output from the conversion circuit, and encode the first data;

a transmission circuit configured to output the first data encoded by the encoder to the first isolation circuit;

a reception circuit configured to receive the second data output from the first isolation circuit; and a decoder configured to decode the second data output from the reception circuit, and output the decoded second data to the output circuit.

6. The semiconductor device according to claim 1, wherein the first signal includes a clock signal, and the state of the clock signal includes one of a duty ratio, a voltage value, and a frequency of the clock signal.

7. The semiconductor device according to claim 2, wherein the first isolation circuit uses one of optical coupling, magnetic coupling, and capacitive coupling to transmit the signal from the first driver to the first receiver.

8. The semiconductor device according to claim 2, wherein the first isolation circuit includes a light emitting diode and a photodiode.

9. The semiconductor device according to claim 2, wherein the first isolation circuit includes a coil.

10. The semiconductor device according to claim 2, wherein the first isolation circuit includes a capacitor.

11. A semiconductor device comprising:

a detection circuit configured to detect a state of a first signal;

a reference voltage circuit configured to change a reference voltage based on the state of the first signal detected by the detection circuit;

an amplification circuit configured to amplify a first voltage, and output a second voltage obtained as a result of amplification;

a conversion circuit configured to convert the second voltage output from the amplification circuit to a first data, using the reference voltage output from the reference voltage circuit; and a correction circuit configured to correct the first signal, wherein the correction circuit outputs the corrected first signal to the conversion circuit, and the conversion circuit converts the second voltage output from the amplification circuit, to the first data, using the corrected first signal.

12. The semiconductor device according to claim 11, further comprising:

a first isolation circuit including a first driver and a first receiver electrically isolated from the first driver, the first driver transmitting a first data signal corresponding to the first data to the first receiver, and the first receiver outputting a second data corresponding to the first data signal transmitted from the first driver;

an output circuit configured to output the second data output from the first isolation circuit, and a second isolation circuit including a second driver and a second receiver electrically isolated from the second driver, wherein the second driver transmits a second data signal corresponding to a second signal to the second receiver, and the second receiver outputs to the detection circuit the first signal corresponding to the second data signal transmitted from the second driver.

13. The semiconductor device according to claim 11, further comprising:

an isolation circuit including a first driver and receiver and a second driver and receiver, the second driver and receiver being electrically isolated from the first driver and receiver, wherein the first driver and receiver transmits a first data signal corresponding to the first data to the second driver and receiver, and the second driver and receiver outputs a second data corresponding to the first data signal transmitted from the first driver and receiver, and the second driver and receiver transmits a second data signal corresponding to a second signal to the first driver and receiver, and the first driver and receiver outputs to the detection circuit the first signal corresponding to the second data signal transmitted from the second driver and receiver.

14. The semiconductor device according to claim 11, further comprising:

an encoder configured to receive the first data output from the conversion circuit, and encode the first data;

a transmission circuit configured to output the first data encoded by the encoder to the first isolation circuit;

a reception circuit configured to receive the second data output from the first isolation circuit; and a decoder configured to decode the second data output from the reception circuit, and output the decoded second data to the output circuit.

15. The semiconductor device according to claim 11, wherein the first signal includes a clock signal, and the state of the clock signal includes one of a duty ratio, a voltage value, and a frequency of the clock signal.

16. The semiconductor device according to claim 12, wherein the first isolation circuit uses one of optical coupling, magnetic coupling, and capacitive coupling to transmit the first data signal from the first driver to the first receiver.

17. The semiconductor device according to claim 12, wherein the first isolation circuit includes a light emitting diode and a photodiode.

18. The semiconductor device according to claim 12, wherein the first isolation circuit includes a coil.

19. The semiconductor device according to claim 12, wherein the first isolation circuit includes a capacitor.

* * * * *